United States Patent
Williams et al.

(10) Patent No.: US 8,754,741 B2
(45) Date of Patent: Jun. 17, 2014

(54) HIGH-RESISTANCE THIN-FILM RESISTOR AND METHOD OF FORMING THE RESISTOR

(71) Applicant: Texas Instruments Incorporated, Dallas, TX (US)

(72) Inventors: Byron Lovell Williams, Plano, TX (US); John Britton Robbins, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 89 days.

(21) Appl. No.: 13/655,419

(22) Filed: Oct. 18, 2012

(65) Prior Publication Data

US 2014/0111301 A1    Apr. 24, 2014

(51) Int. Cl.
*H01C 1/012* (2006.01)
*H01C 7/00* (2006.01)
*H01C 17/075* (2006.01)
*H01C 7/06* (2006.01)
*H01L 27/08* (2006.01)
*H01L 23/525* (2006.01)

(52) U.S. Cl.
CPC .............. *H01C 7/006* (2013.01); *H01C 17/075* (2013.01); *H01C 7/06* (2013.01); *H01L 27/0802* (2013.01); *H01L 23/5258* (2013.01)
USPC ........................................................ 338/308

(58) Field of Classification Search
CPC ........ H01C 7/006; H01C 17/075; H01C 7/06; H01C 13/02; H01C 17/265; H01C 17/02; H01C 17/242; H01C 1/14; H01C 1/142; H01C 17/08; H01C 10/12; H01C 17/006; H01C 17/262; H01C 1/16; H01L 28/20; H01L 27/016; H01L 27/0802; H01L 2924/19043; H01L 21/76843; H01L 21/76873; H01L 27/0688; H01L 23/5228; H01L 21/76877; H05K 1/162; H05K 1/167; H05K 3/467; H05K 2201/0179; H05K 1/0306; H05K 2203/0278; H05K 3/4061; H05K 2203/085; H05K 2203/1476; H05K 2203/308; H05K 3/048; H05K 3/4053; H05K 3/4664; H05K 1/09
USPC .......................................... 338/307, 308, 309
See application file for complete search history.

(56) References Cited

U.S. PATENT DOCUMENTS

| | | | |
|---|---|---|---|
| 8,040,213 B2 * | 10/2011 | Ashikaga ....................... 338/314 |
| 8,089,135 B2 * | 1/2012 | Lindgren et al. ............... 257/532 |
| 8,242,876 B2 * | 8/2012 | Le Neel et al. ................. 338/25 |
| 2008/0122035 A1 * | 5/2008 | Watanabe ...................... 257/536 |

* cited by examiner

*Primary Examiner* — Kyung Lee
(74) *Attorney, Agent, or Firm* — Jacqueline J. Garner; Wade J. Brady, III; Frederick J. Telecky, Jr.

(57) ABSTRACT

The resistance of a thin-film resistor is substantially increased by forming the thin-film resistor to line one or more non-conductive trenches. By lining the one or more non-conductive trenches, the overall length of the resistor is increased while still consuming approximately the same surface area as a conventional resistor.

20 Claims, 19 Drawing Sheets

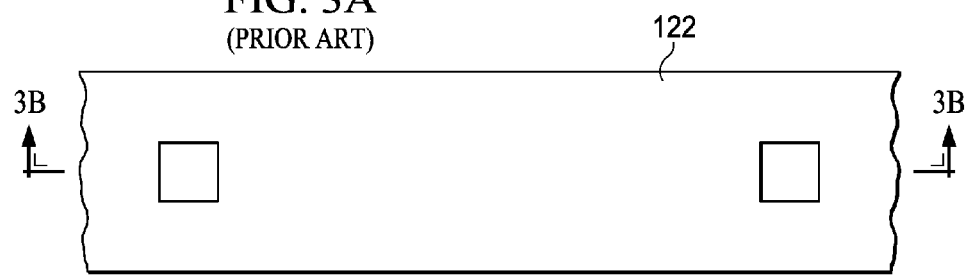
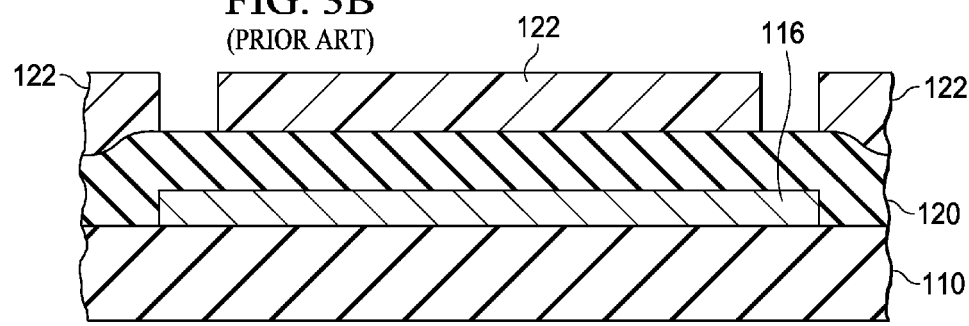
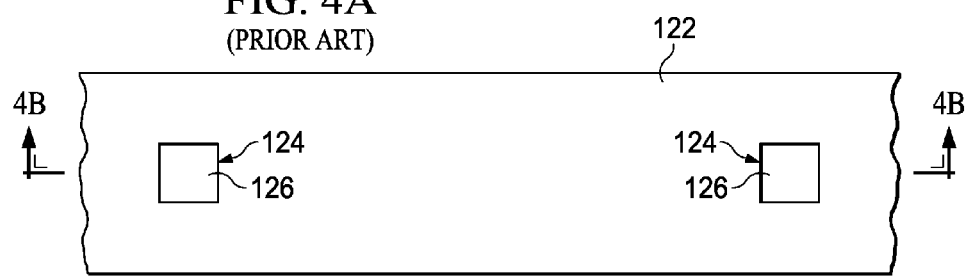
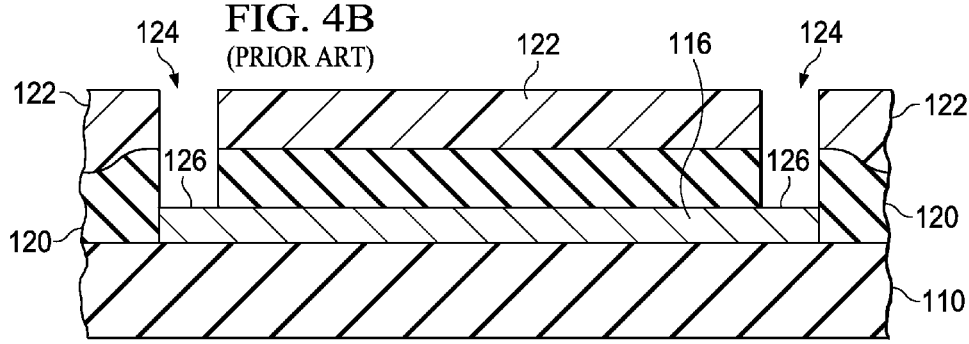

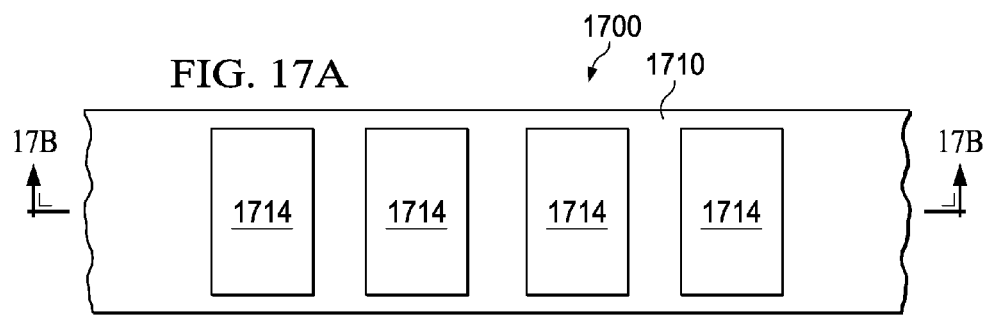
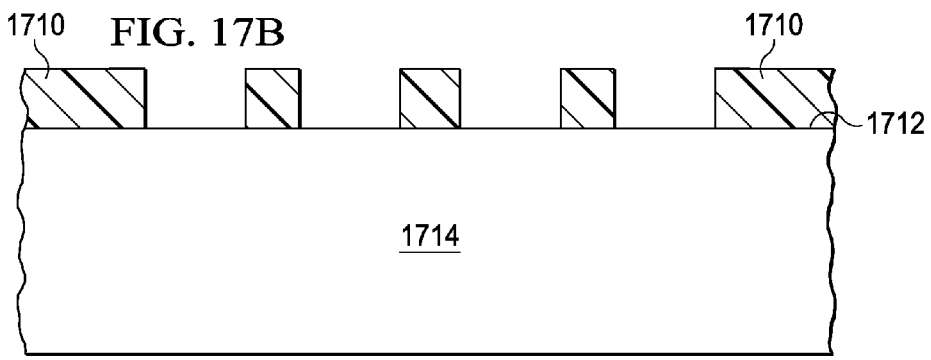
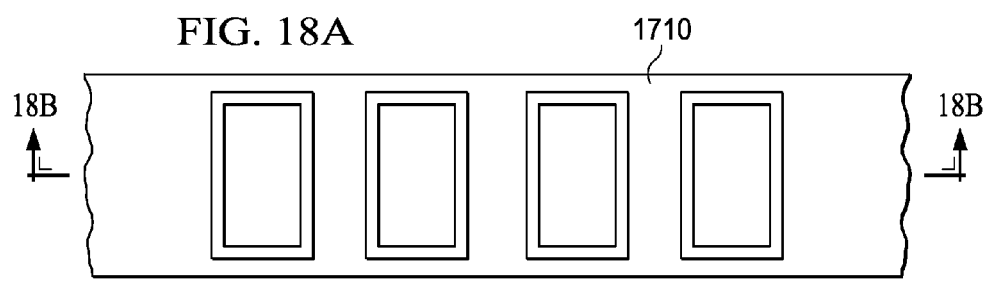
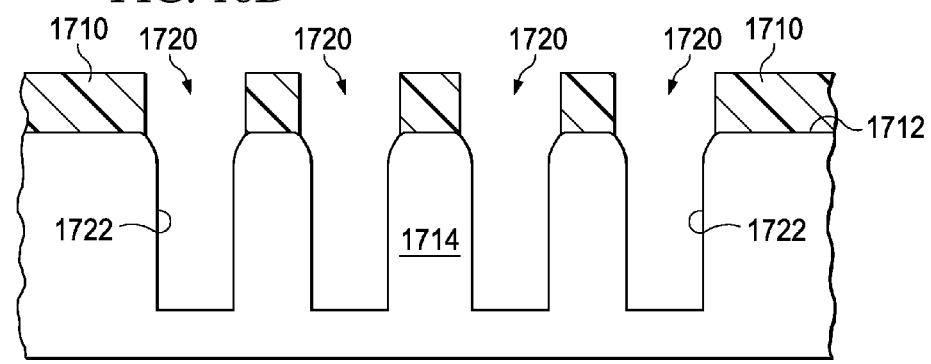

HIGH-RESISTANCE THIN-FILM RESISTOR AND METHOD OF FORMING THE RESISTOR

BACKGROUND OF THE INVENTION

1. Field of the Invention

The present invention relates to thin-film resistors and, more particularly, to a high-resistance thin-film resistor and a method of forming the resistor.

2. Description of the Related Art

A thin-film resistor is a semiconductor resistor that, as the name implies, is formed from a thin film of conducting resistive material. As with conventionally-formed discrete resistors, thin-film resistors are formed to provide a predefined resistance to the flow of current through the resistor.

FIGS. 1A-1B to 7A-7B show a series of views that illustrate a prior-art method 100 of forming a thin-film resistor that provides a predefined resistance. FIGS. 1A-7A show a series of plan views, while FIGS. 1B-7B show a series of cross-sectional views taken along lines 1B-1B through 7B-7B of FIGS. 1A-7A.

As shown in FIGS. 1A-1B, method 100 utilizes a conventionally-formed layer of insulation material 110, and begins with the sputter deposition of a thin layer of resistor material 112 on insulation layer 110. The thin layer of resistor material 112 can be implemented with, for example, a layer of titanium nitride (TiN) or a layer of tantalum nitride (TaN).

After the thin layer of resistor material 112 has been deposited, a patterned photoresist layer 114 is formed on the thin layer of resistor material 112. Patterned photoresist layer 114 is formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

As shown in FIGS. 2A-2B, after patterned photoresist layer 114 has been formed, the exposed areas of the thin layer of resistor material 112 are etched to form a substantially-planar thin-film resistor structure 116 that touches the top surface of insulation layer 110. Once the etch has been completed, patterned photoresist layer 114 is removed in a conventional fashion, such as with an ash process.

Next, as shown in FIGS. 3A-3B, after patterned photoresist layer 114 has been removed, a layer of isolation material 120 is conventionally deposited using, for example, chemical vapor deposition. Following this, a patterned photoresist layer 122 is conventionally formed on isolation layer 120.

As shown in FIGS. 4A-4B, once patterned photoresist layer 122 has been formed, the exposed regions of isolation layer 120 are etched to form a pair of spaced-apart openings 124 in isolation layer 120 that expose a pair of spaced-apart surface regions 126 on the top surface of thin-film resistor structure 116. Once the pair of spaced-apart surface regions 126 have been exposed, patterned photoresist layer 122 is removed in a conventional manner.

As shown in FIGS. 5A-5B, following the removal of patterned photoresist layer 122, a layer of contact metal 130 is deposited in a conventional fashion to fill up the pair of openings 124 and cover the top surface of isolation layer 120. After contact metal layer 130 has been formed, a patterned photoresist layer 132 is conventionally formed on contact metal layer 130.

As shown in FIGS. 6A-6B, after patterned photoresist layer 132 has been formed, the exposed area of contact metal layer 130 is etched to form a pair of spaced-apart metal head contacts 134 that extend through isolation layer 120 to touch, and make electrical connections to, the pair of spaced-apart surface regions 126 on the top surface of thin-film resistor structure 116.

As shown in FIGS. 7A-7B, once the etch has been completed, patterned photoresist layer 132 is removed in a conventional fashion to form a thin-film resistor 140. As further shown in FIGS. 7A-7B, thin-film resistor 140 occupies an area on the top surface of insulation material 110, which in large part is defined by the length L times the width W of thin-film resistor structure 116.

One of the drawbacks of thin-film resistor 140 is that it is difficult to increase the resistance of thin-film resistor 140. One common approach to increasing the resistance of thin-film resistor 140 is to use a different higher-resistance material when depositing the thin layer of resistor material 112. Exotic materials that have high resistances, however, are often difficult or expensive to use in a conventional fabrication process.

Another common approach to increasing the resistance of thin-film resistor 140 is to increase the length of resistor 140 (and the spacing that lies between the metal head contacts 134). Significantly increasing the length of thin-film resistor 140, however, significantly increases the surface area that thin-film resistor 140 consumes which, in turn, increases the size and cost of a die that includes thin-film resistor 140.

Thus, there is a need for an approach to increasing the resistance of a thin-film resistor.

SUMMARY OF THE INVENTION

The present invention provides a high-resistance semiconductor resistor and a method of forming the semiconductor resistor that increases the resistance. A resistor of the present invention includes a body that has a non-conductive top surface, and one or more trenches that each extends down from the non-conductive top surface into the body. Each of the one or more trenches has a non-conductive inner surface. The resistor of the present invention also includes a thin-film resistor structure that touches a first portion of the non-conductive top surface and a first portion of the inner surface of each of the one or more trenches, and exposes a second portion of the non-conductive top surface.

A method of forming a resistor includes forming a body that has a non-conductive top surface, and one or more trenches that each extends down from the non-conductive top surface into the body. Each of the one or more trenches has a non-conductive inner surface. The method also includes depositing a metal layer that touches the non-conductive top surface and the inner surface of each of the one or more trenches, and forms one or more holes. The method further includes etching the metal layer to form a thin-film resistor structure that touches a first portion of the non-conductive top surface and a first portion of the inner surface of each of the one or more trenches, and exposes a second portion of the non-conductive top surface.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 1A-7A are a series of plan views, while FIGS. 1B-7B are a series of cross-sectional views taken along lines 1B-1B through 7B-7B of FIGS. 1A-7A.

FIGS. 8A-13A are a series of plan views, while FIGS. 8B-13B are a series of cross-sectional views taken along lines 8B-8B through 13B-13B of FIGS. 8A-13A.

FIGS. 14A-16A are a series of plan views, while FIGS. 14B-16B are a series of cross-sectional views taken along lines 14B-14B through 16B-16B of FIGS. 14A-16A.

FIGS. 17A-17B to 19A-19B are a series of views illustrating an example of a second method 1700 of forming body 810 in accordance with the present invention. FIGS. 17A-19A are a series of plan views, while FIGS. 17B-19B are a series of cross-sectional views taken along lines 17B-17B through 19B-19B of FIGS. 17A-19A.

FIGS. 20A-22A are a series of plan views, while FIGS. 20B-22B are a series of cross-sectional views taken along lines 20B-20B through 22B-22B of FIGS. 20A-22A.

FIGS. 23A-25A are a series of plan views, while FIGS. 23B-25B are a series of cross-sectional views taken along lines 23B-23B through 25B-25B of FIGS. 23A-25A.

DETAILED DESCRIPTION OF THE INVENTION

FIGS. 8A-8B to 13A-13B show a series of views that illustrate an example of a method 800 of forming a thin-film resistor in accordance with the present invention. FIGS. 8A-13A show a series of plan views, while FIGS. 8B-13B show a series of cross-sectional views taken along lines 8B-8B through 13B-13B of FIGS. 8A-13A.

Figure 1A:
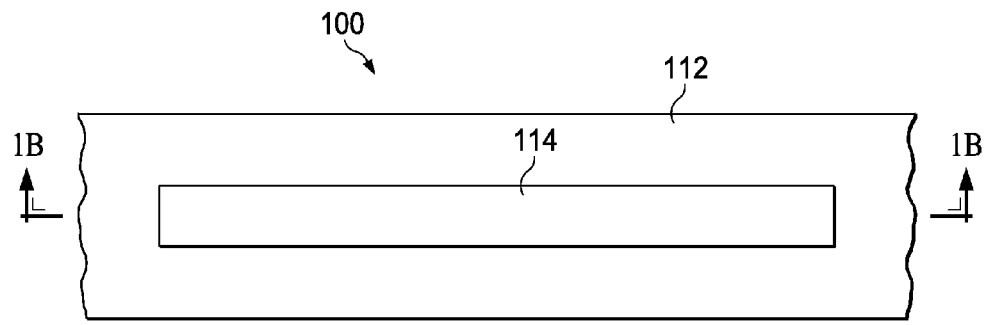
FIGS. 1A-1B to 7A-7B are a series of views illustrating a prior-art method 100 of forming a thin-film resistor.
Figure 1B:
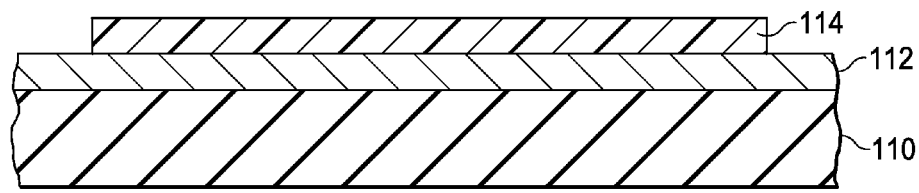
Figure 2A:
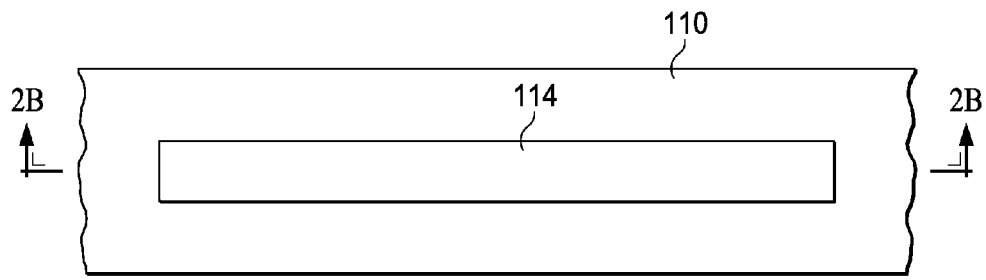
Figure 2B:
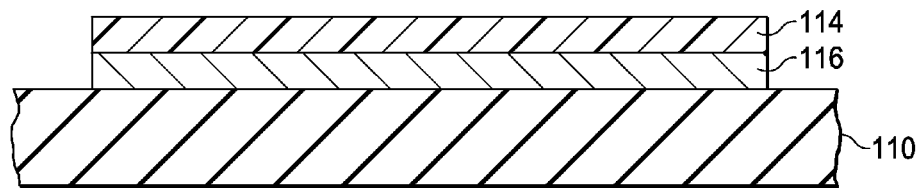
Figure 5A:
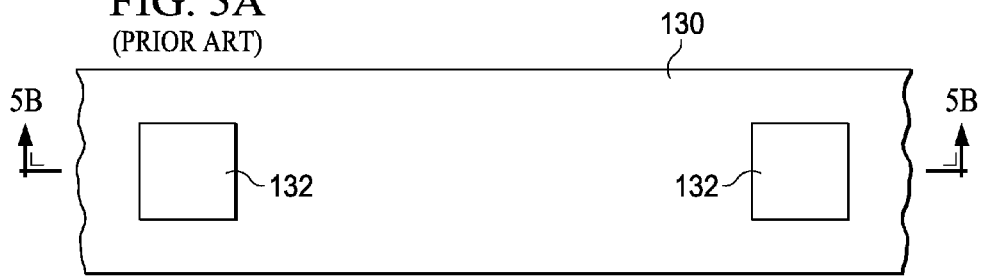
Figure 5B:
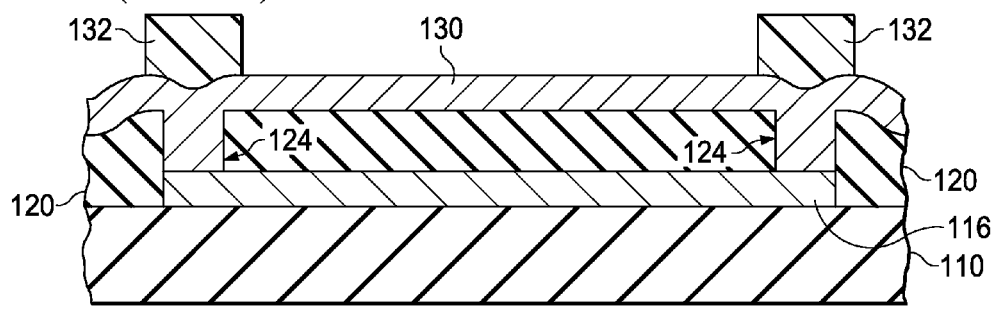
Figure 6A:
Figure 6B:
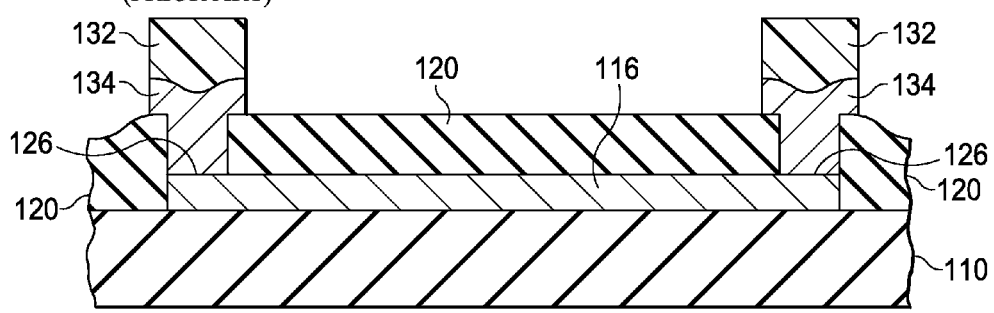
Figure 7A:
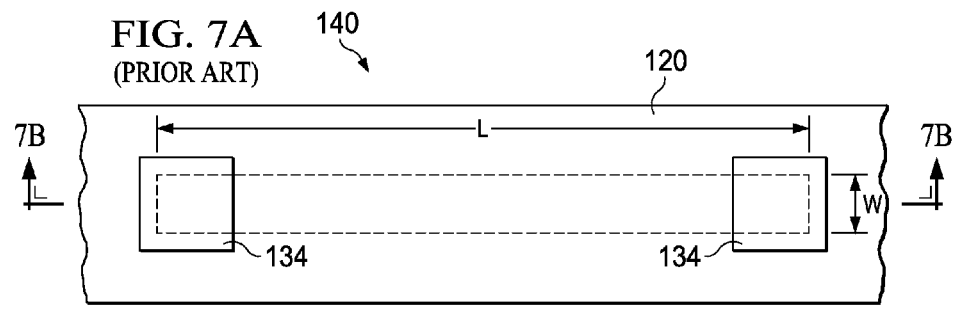
Figure 7B:
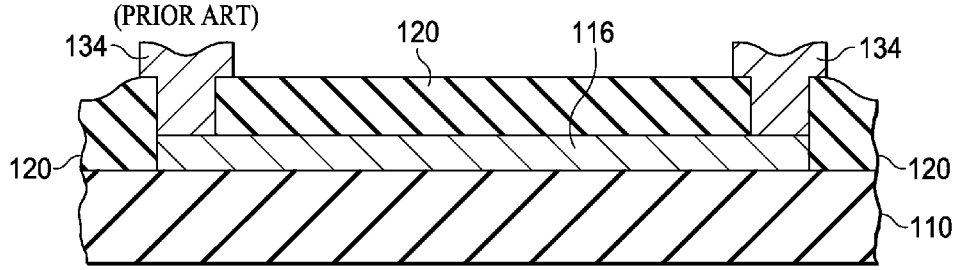
Figure 8A:
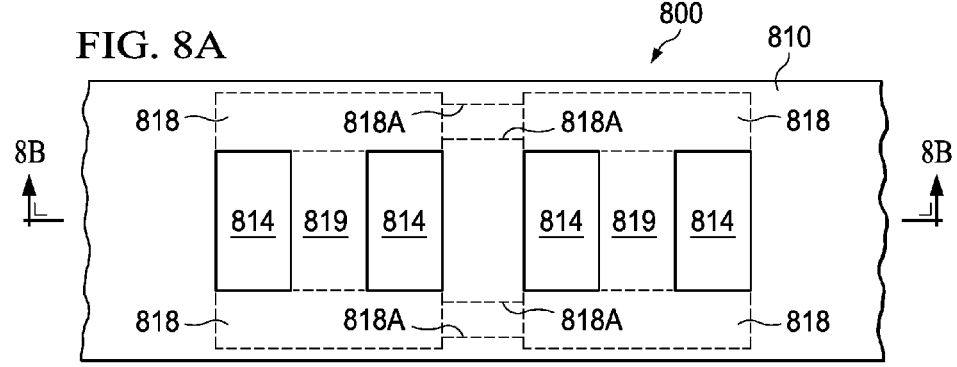
FIGS. 8A-8B to 13A-13B are a series of views illustrating an example of a method 800 of forming a thin-film resistor in accordance with the present invention.
Figure 8B:
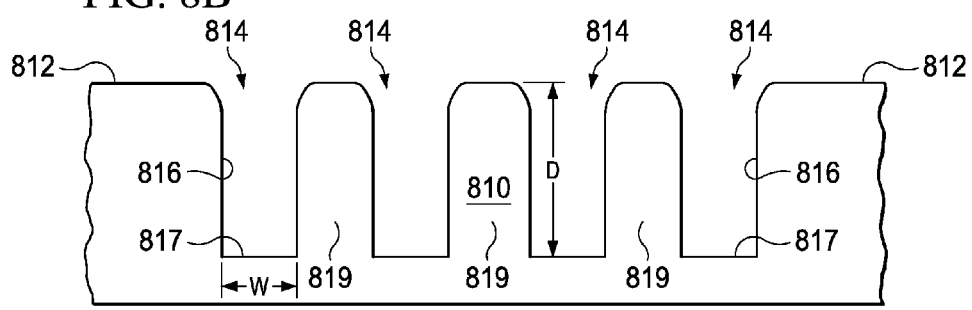

As shown in FIGS. 8A-8B, method 800 begins by forming a body 810. Body 810, in turn, includes a non-conductive top surface 812 and one or more trenches 814. Each of the one or more trenches 814 extends down from the non-conductive top surface 812 into body 810. In addition, each of the one or more trenches 814 has a non-conductive inner surface 816 such that no trench 814 exposes any conductive portion of body 810.

Non-conductive inner surface 816, in turn, includes a bottom surface 817. Further, each of the one or more trenches 814 has a length, a width W orthogonal to the length, and a depth D orthogonal to the length and the width W that extends from the non-conductive top surface 812 to the bottom surface 817.

The width-to-depth ratio of the one or more trenches 814 is a function of a number of factors, including the required resistance and the available silicon real estate, and includes, for example, ratios of 10:1, 3:1, 1:1, 1:3, and 1:10, with the maximum depth limited by the limitations of the fabrication equipment. In the present example, the depth D is greater than the width W. As also shown in the present example, the depths D of two or more trenches 814 are substantially the same.

In an alternate embodiment, as shown by the dashes 818 in FIG. 8A, the one or more trenches 814 can be formed as loops, which in turn form a number of pillars 819. In a further alternate embodiment, as shown by the dashes 818 and 818A, a single trench 814 with a number of loops can be formed, which in turn forms the pillars 819.

Figure 9A:
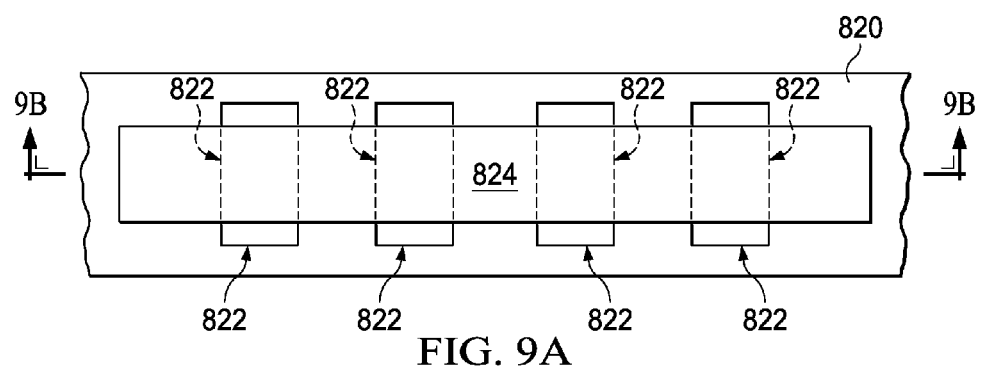
Figure 9B:
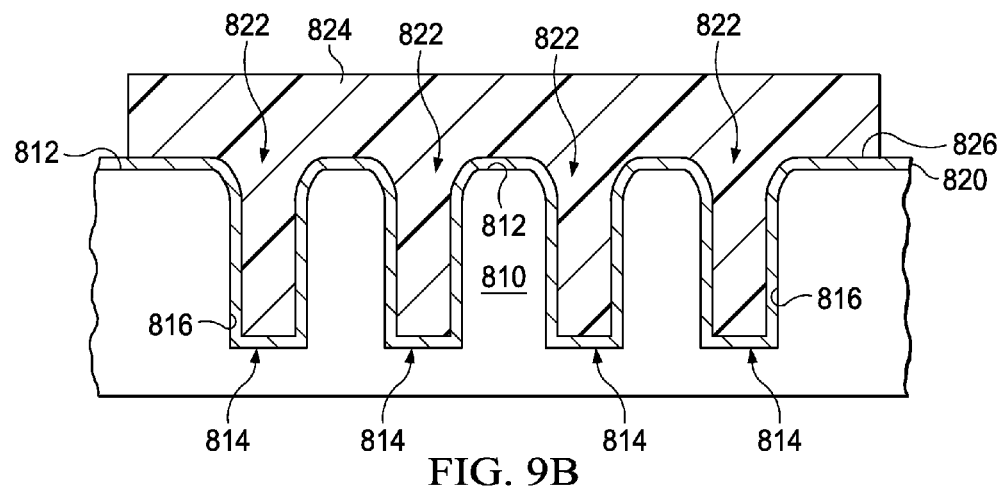

As shown in FIGS. 9A-9B, after body 810 with the non-conductive top surface 812 and the one or more trenches 814 has been formed, a thin layer of resistor material 820, such as a layer of titanium nitride (TiN), tantalum nitride (TaN), or other high resistance materials, is next deposited to touch the top surface 812 of body 810. The thin layer of resistor material 820 also extends down into each of the one or more trenches 814 to touch and line the inner surface 816 of each of the one or more trenches 814, and form one or more holes 822. As a result, the one or more holes 822 differ in size from the one or more trenches 814 by the thickness of the thin layer of resistor material 820.

In the present example, the thin layer of resistor material 820 is deposited using atomic layer deposition (ALD), which is a well-known approach that allows one or more layers of atoms to be deposited. One of the advantages of using an ALD process is that the pitch of the trenches 814 (essentially the spacing between the trenches 814) can be smaller. Another advantage of using an ALD process is that the thickness of the thin layer of resistor material 820 can be very accurately controlled. Thus, adjacent resistors can have substantially matching thicknesses, which increases the precision and linearity of the resistors when in designs such as digital-to-analog (D/A) converters.

Further in the present example, the thin layer of resistor material 820 is formed to have a thickness in the range of 20 Å-200 Å. After the thin layer of resistor material 820 has been deposited, a patterned photoresist layer 824 is formed on the thin layer of resistor material 820. Patterned photoresist layer 824, in turn, is formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

Figure 10A:
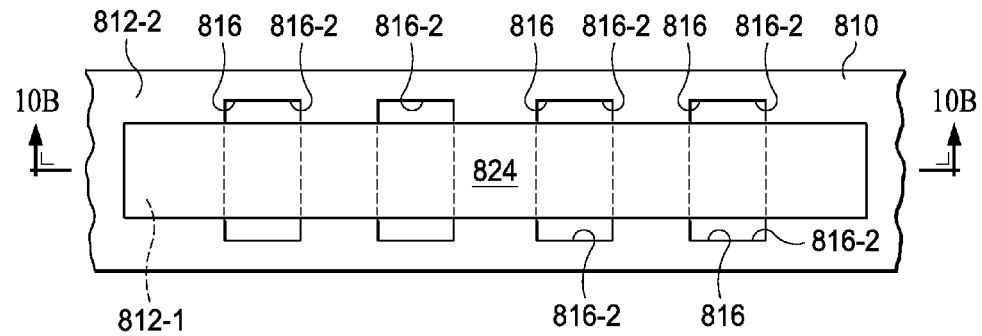
Figure 10B:
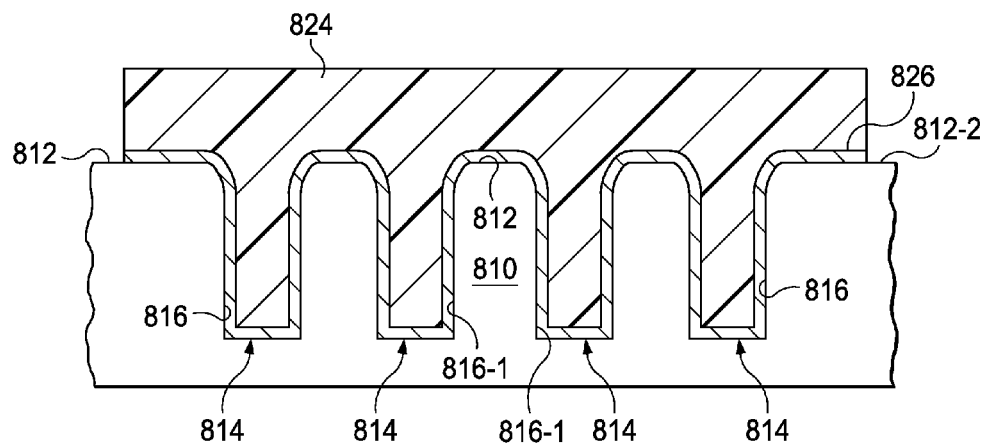

As shown in FIGS. 10A-10B, after patterned photoresist layer 824 has been formed, the exposed areas of the thin layer of resistor material 820 shown in FIGS. 9A-9B are etched. As further shown in FIGS. 10A-10B, the etch forms a thin-film resistor structure 826 that touches a first portion 812-1 of the top surface 812 of body 810, and extends down into each of the one or more trenches 814 to touch a first portion 816-1 of the inner surface 816 of each of the one or more trenches 814.

In the present example, the etch also exposes a second portion 812-2 of the non-conductive top surface 812, and a number of second portions 816-2 of the inner surface 816 of each of the one or more trenches 814. Following the etch, patterned photoresist layer 824 is removed in a conventional manner, such as with an ash process.

Figure 11A:
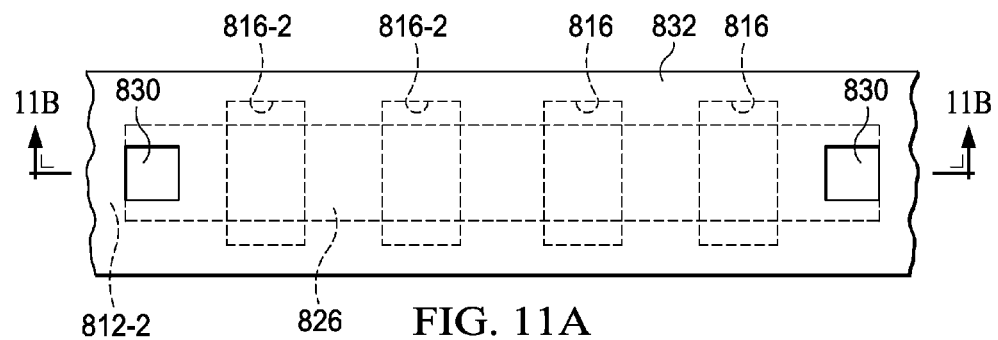
Figure 11B:
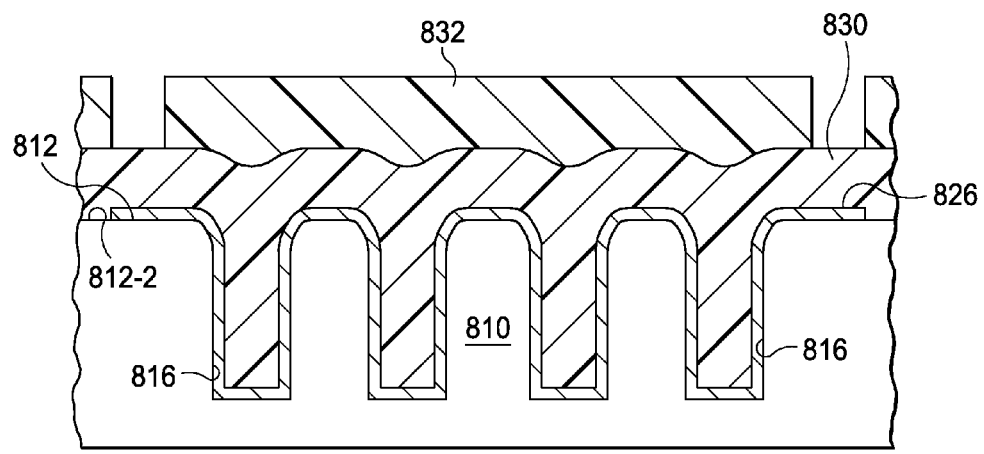

Next, as shown in FIGS. 11A-11B, after patterned photoresist layer 824 has been removed, a layer of isolation material 830 is deposited to touch the second portion 812-2 of the non-conductive top surface 812, the second portions 816-2 of the inner surface 816 of each of the one or more trenches 814, and the thin-film resistor structure 826.

In the present example, isolation material 830 is deposited using an ALD process, followed by a chemical vapor deposition process. Alternately, isolation material 830 can be deposited using only an ALD process, only a chemical vapor deposition process, or any combination of the two. Next, after isolation material 830 has been deposited, a patterned photoresist layer 832 is conventionally formed on isolation material 830.

Figure 12A:
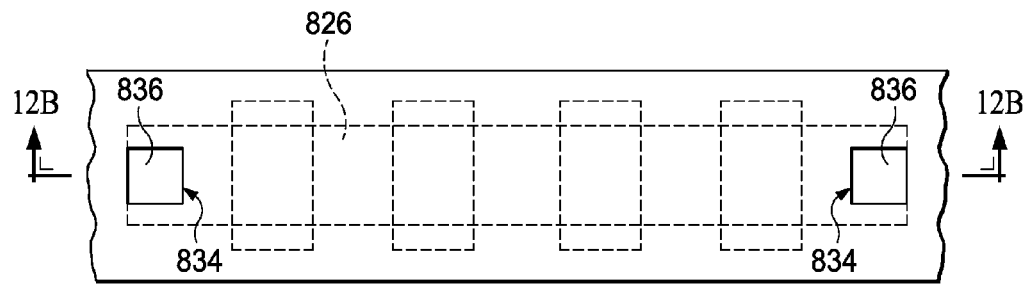
Figure 12B:
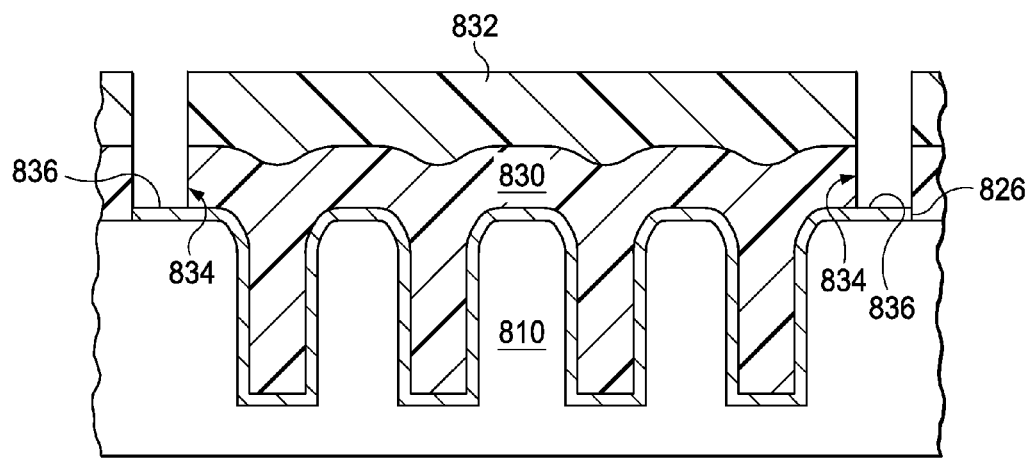

As shown in FIGS. 12A-12B, once patterned photoresist layer 832 has been formed, the exposed regions of isolation material 830 are next etched to form a pair of spaced-apart openings 834 in isolation material 830 that expose a pair of spaced-apart surface regions 836 on the top surface of thin-film resistor structure 826. Once the spaced-apart surface regions 836 have been exposed, patterned photoresist layer 832 is removed in a conventional manner.

Figure 13A:
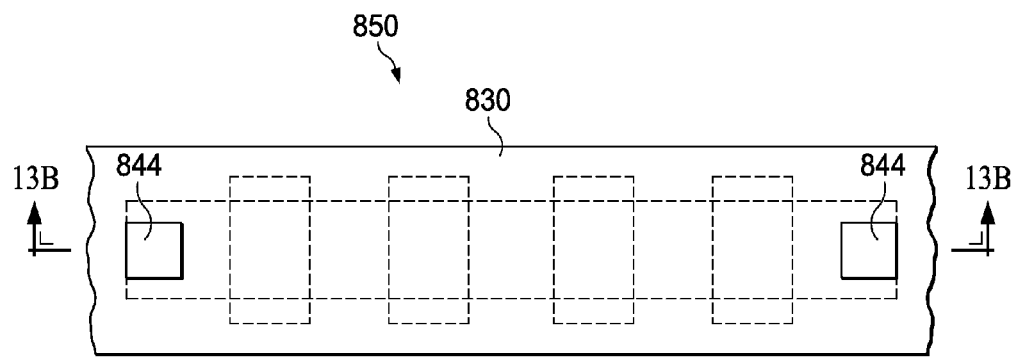
Figure 13B:
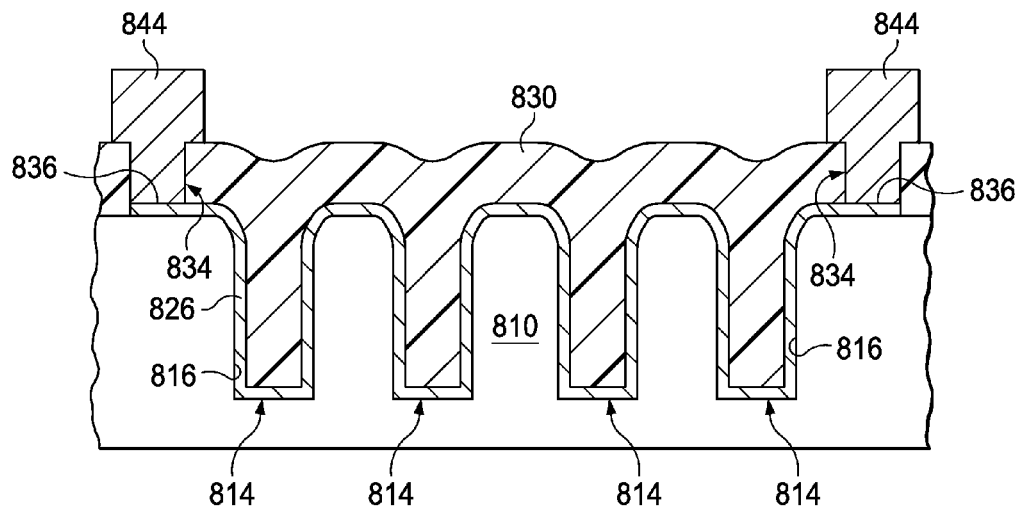

As shown in FIGS. 13A-13B, following the removal of patterned photoresist layer 832 shown in FIGS. 12A-12B, a pair of metal head contacts 844 are formed in the pair of spaced-apart openings 834 to extend through the layer of isolation material 830 and touch the spaced-apart surface regions 836 of thin-film resistor structure 826, and make electrical connections to the opposite ends of thin-film resistor structure 826.

The formation of the pair of metal head contacts 844 completes the formation of a thin-film resistor 850. Thus, as further shown in FIGS. 13A-13B, thin-film resistor 850 extends down into each of the one or more trenches 814 to touch a portion of the interior surface 816 of each of the one or more trenches 814.

One of the advantages of the present invention is that since thin-film resistor 850 extends down and touches a portion of the interior surface 816 of each of the one or more trenches 814, thin-film resistor 850 is substantially longer and more resistive than thin-film resistor 140. However, since the substantially increased length and resistance are due to thin-film resistor 850 extending down and touching a portion of the interior surface 816 of each of the one or more trenches 814, thin-film resistor 850 occupies approximately the same surface area as thin-film resistor 140. Thus, the present invention provides substantially more resistance in approximately the same area.

Body 810 can be formed in a number of ways. FIGS. 14A-14B to 16A-16B show a series of views that illustrate an example of a first method 1400 of forming body 810 in accordance with the present invention. FIGS. 14A-16A show a series of plan views, while FIGS. 14B-16B show a series of cross-sectional views taken along lines 14B-14B through 16B-16B of FIGS. 14A-16A.

Figure 14A:
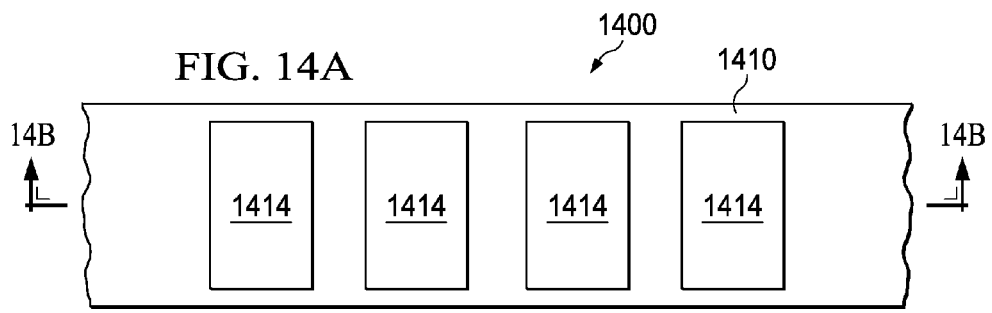
FIGS. 14A-14B to 16A-16B are a series of views illustrating an example of a first method 1400 of forming body 810 in accordance with the present invention.
Figure 14B:
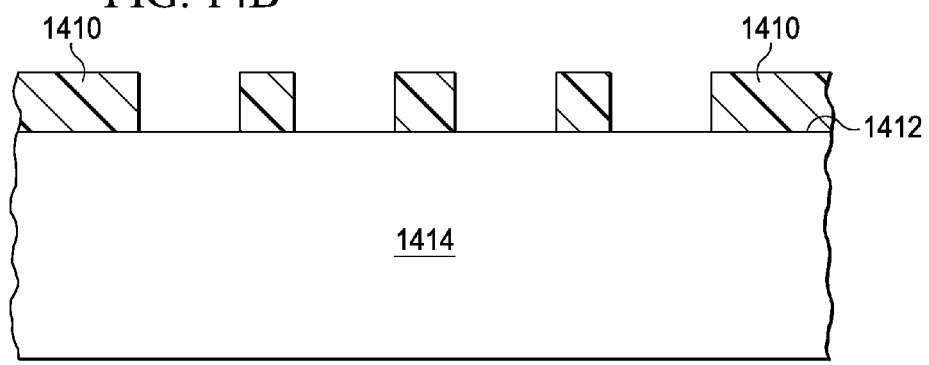

As shown in FIGS. 14A-14B, the first method 1400 begins by forming a patterned photoresist layer 1410 on a top surface 1412 of a conventionally-formed substrate structure 1414. Substrate structure 1414 can be implemented with, for example, a semiconductor material such as single-crystal silicon or silicon germanium. Patterned photoresist layer 1410 is formed in a conventional manner.

Figure 15A:
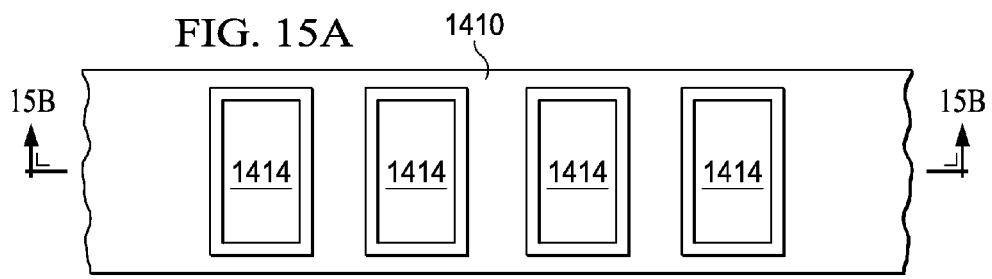
Figure 15B:
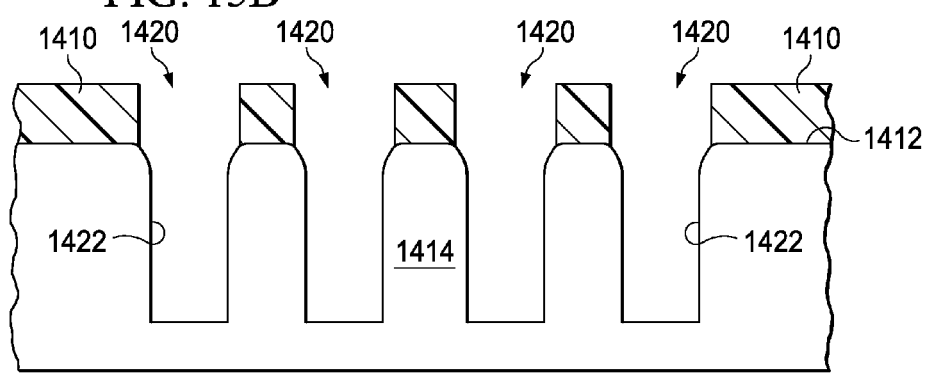

As shown in FIGS. 15A-15B, after patterned photoresist layer 1410 has been formed, the exposed areas of substrate structure 1414 are etched in a conventional manner to form one or more openings 1420. Each of the openings 1420 has an inner surface 1422 that extends from the top surface 1412 of substrate structure 1414 down into substrate structure 1414. (With respect to the alternate embodiments, the one or more openings 1420 can be formed as one or more loops as illustrated by the dashes 818 and 818A shown in FIG. 8A by modifying the pattern in patterned photoresist layer 1410.)

As further shown in FIGS. 15A-15B, the etch wears away the sides of patterned photoresist layer 1410 which, in turn, causes the top edges of the openings 1420 to be advantageously rounded off. Other well-known approaches can alternately be used to round off the top edges of the one or more openings 1420. Once the etch has been completed, patterned photoresist layer 1410 is removed in a conventional fashion.

Figure 16A:
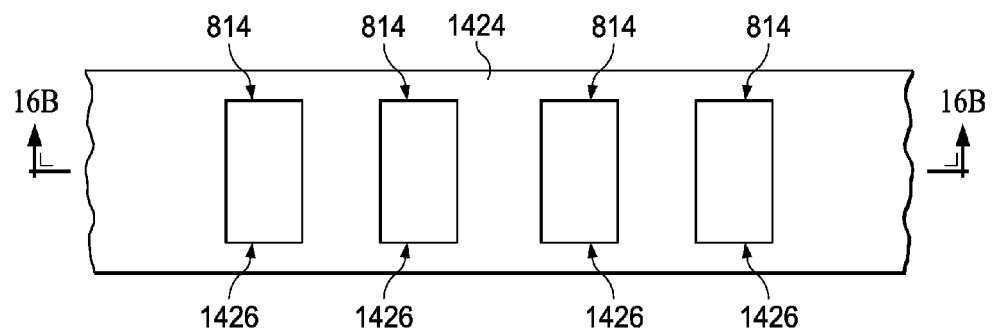
Figure 16B:
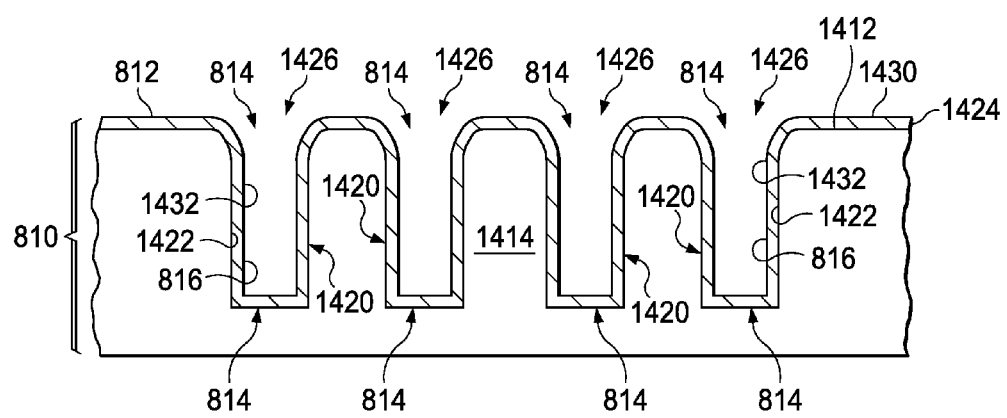

As shown in FIGS. 16A-16B, after patterned photoresist layer 1410 shown in FIGS. 15A-15B has been removed, a non-conductive layer 1424 is formed to touch the top surface 1412 of substrate structure 1414. Non-conductive layer 1424 also extends down into each of the one or more openings 1420 to touch and cover the inner surface 1422 of each of the one or more openings 1420, and form one or more trenches 1426.

Non-conductive layer 1424, in turn, has a top surface 1430. In addition, each of the one or more trenches 1426 has a non-conductive inner surface 1432 such that no trench 1426 exposes any conductive portion of substrate structure 1414. As a result, the one or more trenches 1426 differ in size from the one or more openings 1420 by the thickness of non-conductive layer 1424.

Non-conductive layer 1424 can be thermally grown or deposited using a conventional chemical vapor deposition process. In the present example, non-conductive layer 1424 has a thickness of 20 Å-100 Å. The combination of substrate structure 1414 and non-conductive layer 1424 form body 810. The top surface 1426 of non-conductive layer 1424 forms the non-conductive top surface 812 of body 810. In addition, the one or more trenches 1426 each with inner surface 1432 form the one or more trenches 814 each with inner surface 816.

FIGS. 17A-17B to 19A-19B show a series of views that illustrate an example of a second method 1700 of forming body 810 in accordance with the present invention. FIGS. 17A-19A show a series of plan views, while FIGS. 17B-19B show a series of cross-sectional views taken along lines 17B-17B through 19B-19B of FIGS. 17A-19A.

As shown in FIGS. 17A-17B, the second method 1700 begins by forming a patterned photoresist layer 1710 on a top surface 1712 of a conventionally-formed non-conductive structure 1714. Patterned photoresist layer 1710 is formed in a conventional fashion. Non-conductive structure 1714 can be implemented with a non-conductive substrate or die, or as a non-conductive region within a metal interconnect structure, such as a region of an interlayer dielectric.

As shown in FIGS. 18A-18B, after patterned photoresist layer 1710 has been formed, the exposed areas of non-conductive structure 1714 are etched in a conventional manner to form one or more trenches 1720. Each of the trenches 1720 has an inner surface 1722 that extends from the top surface 1712 of non-conductive structure 1714 down into non-conductive structure 1714. (With respect to the alternate embodiments, the one or more trenches 1720 can be formed as one or more loops as illustrated by the dashes 818 and 818A shown in FIG. 8A by modifying the pattern in patterned photoresist layer 1710.)

As further shown in FIGS. 18A-18B, the etch wears away the sides of patterned photoresist layer 1710 which, in turn, causes the top edges of the trenches 1720 to be advantageously rounded off. Other well-known approaches can alternately be used to round off the top edges of the one or more trenches 1720. Once the etch has been completed, patterned photoresist layer 1710 is removed in a conventional fashion.

Figure 19A:
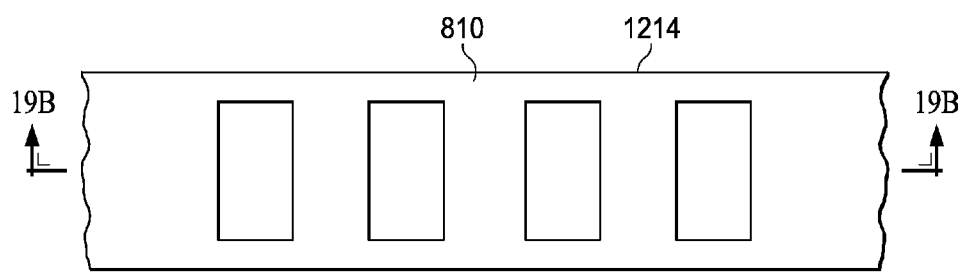
Figure 19B:
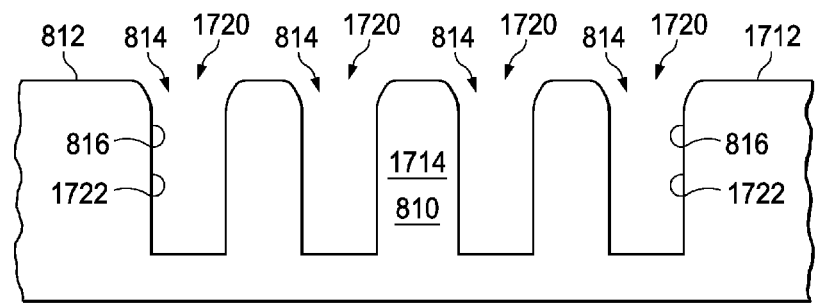

As shown in FIGS. 19A-19B, the removal of patterned photoresist layer 1710 from non-conductive structure 1714 forms body 810. The top surface 1712 of non-conductive structure 1714 forms the non-conductive top surface 812 of body 810. In addition, the one or more trenches 1720 each with inner surface 1722 form the one or more trenches 814 each with inner surface 816.

The pair of metal head contacts 844 can also be formed in a number of ways. FIGS. 20A-20B to 22A-22B show a series of views that illustrate an example of a first method 2000 of forming the pair of metal head contacts 844 in accordance with the present invention. FIGS. 20A-22A show a series of plan views, while FIGS. 20B-22B show a series of cross-sectional views taken along lines 20B-20B through 22B-22B of FIGS. 20A-22A.

Figure 20A:
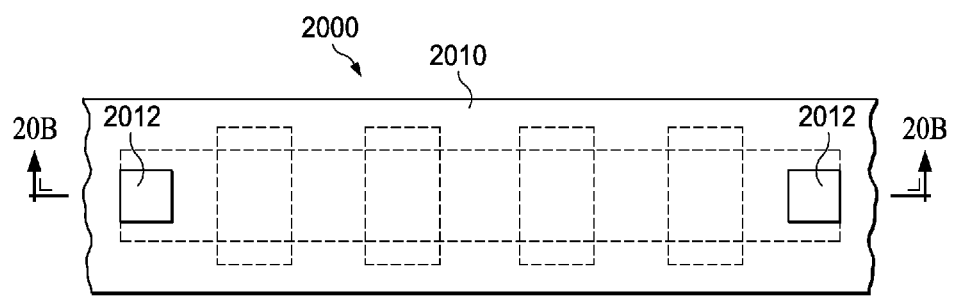
FIGS. 20A-20B to 22A-22B are a series of views illustrating an example of a first method 2000 of forming the pair of metal head contacts 844 in accordance with the present invention.
Figure 20B:
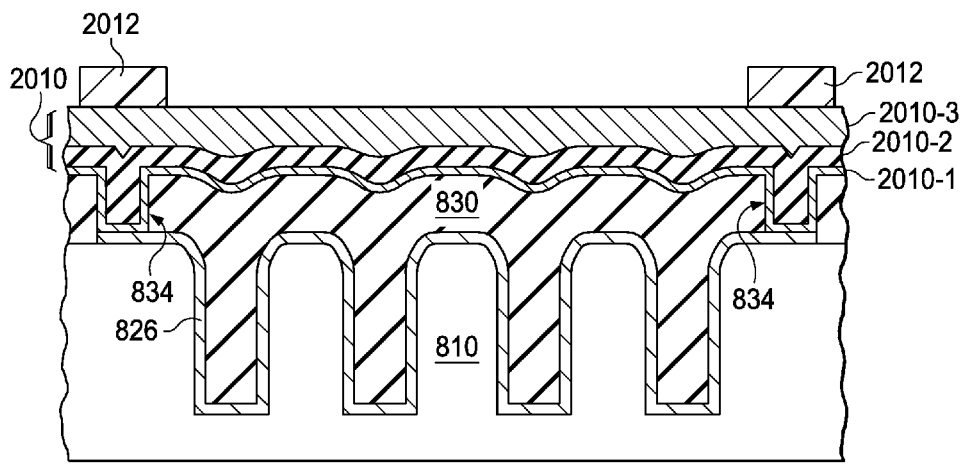

As shown in FIGS. 20A-20B, the first method 2000 begins after the removal of patterned photoresist layer 832 shown in FIGS. 12A-12B, and continues by depositing a layer of contact metal 2010 in a conventional fashion to cover the top surface of isolation material 830 and fill up the spaced-apart openings 834. In the present example, contact metal layer 2010 is implemented with a layer of titanium 2010-1, an overlying layer of titanium nitride 2010-2, and an overlying layer of aluminum 2010-3. After contact metal layer 2010 has been formed, a patterned photoresist layer 2012 is conventionally formed on contact metal layer 2010.

Figure 21A:
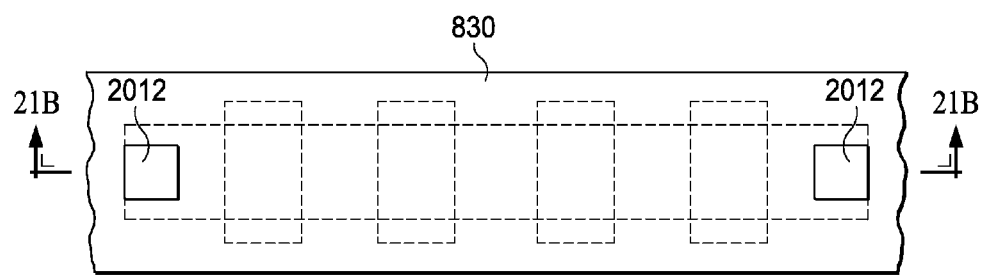
Figure 21B:
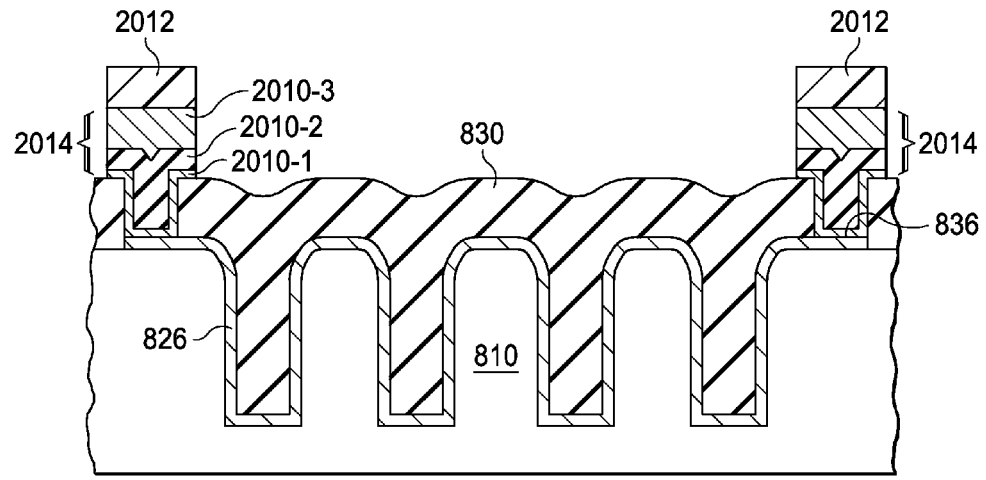
Figure 22A:
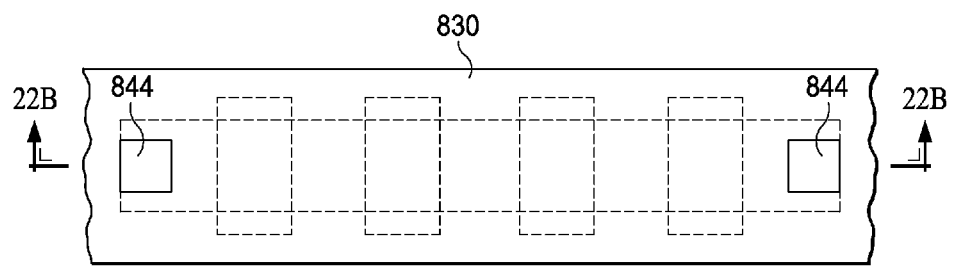
Figure 22B:
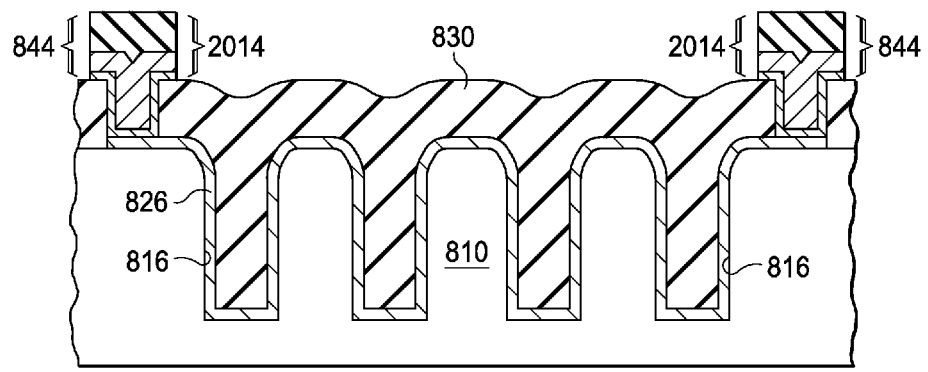

As shown in FIGS. 21A-21B, after patterned photoresist layer 2012 has been formed, the exposed area of contact metal layer 2010 is etched to form a pair of spaced-apart metal head contacts 2014 that extend through the layer of isolation material 830 to touch the spaced-apart surface regions 836 of thin-film resistor structure 826, and make electrical connections to the opposite ends of thin-film resistor structure 826. Once the etch has been completed, patterned photoresist layer 2012 is removed in a conventional fashion. As shown in FIGS. 22A-22B, the pair of spaced-apart metal head contacts 2014 forms the pair of spaced-apart metal head contacts 844.

FIGS. 23A-23B to 25A-25B show a series of views that illustrate an example of a second method 2300 of forming the pair of metal head contacts 844 in accordance with the present invention. FIGS. 23A-25A show a series of plan views, while FIGS. 23B-25B show a series of cross-sectional views taken along lines 23B-23B through 25B-25B of FIGS. 23A-25A.

Figure 23A:
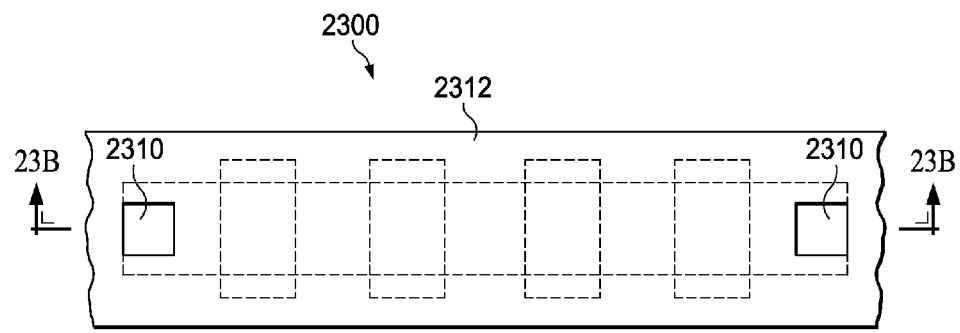
FIGS. 23A-23B to 25A-25B are a series of views illustrating an example of a second method 2300 of forming the pair of metal head contacts 844 in accordance with the present invention.
Figure 23B:
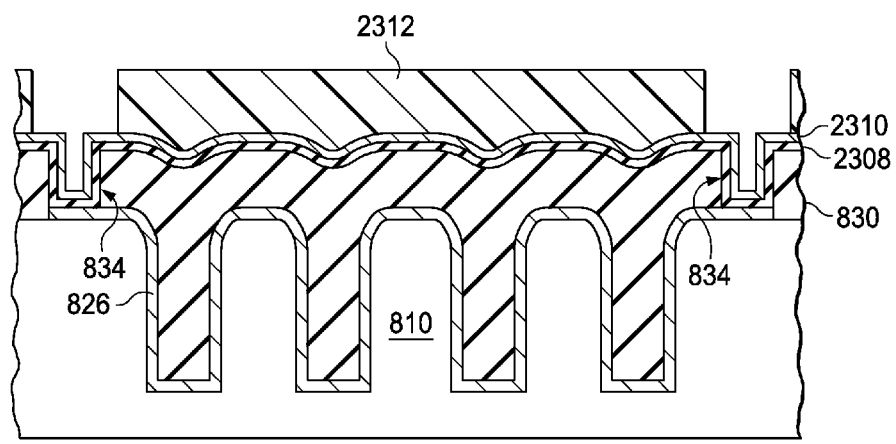

As shown in FIGS. 23A-23B, the second method 2300 begins after the removal of patterned photoresist layer 832 shown in FIGS. 12A-12B, and continues by depositing a barrier layer 2308 in a conventional manner to cover the top surface of isolation material 830 and line the spaced-apart openings 834. Barrier layer 2308 can be implemented with, for example, tantalum or tantalum nitride.

Following this, a seed layer 2310 is deposited in a conventional fashion to cover the barrier layer 2308. Seed layer 2310 can be implemented with, for example, a titanium layer and an overlying copper layer. (The titanium layer enhances the adhesion of the copper.) After seed layer 2310 has been formed, a plating mold 2312 is formed on seed layer 2310. Plating mold 2312 can be formed, for example, by depositing and patterning a photoresist layer in a conventional manner.

Figure 24A:
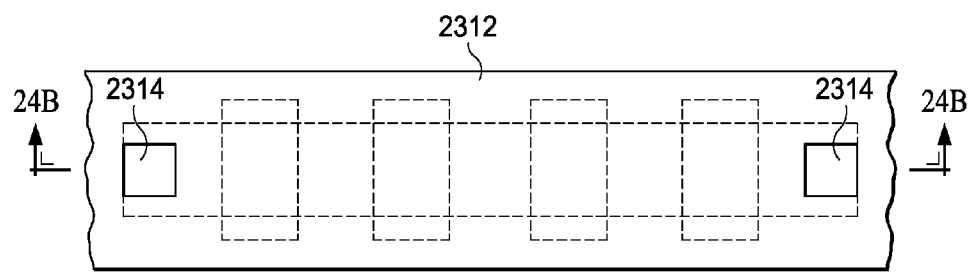
Figure 24B:
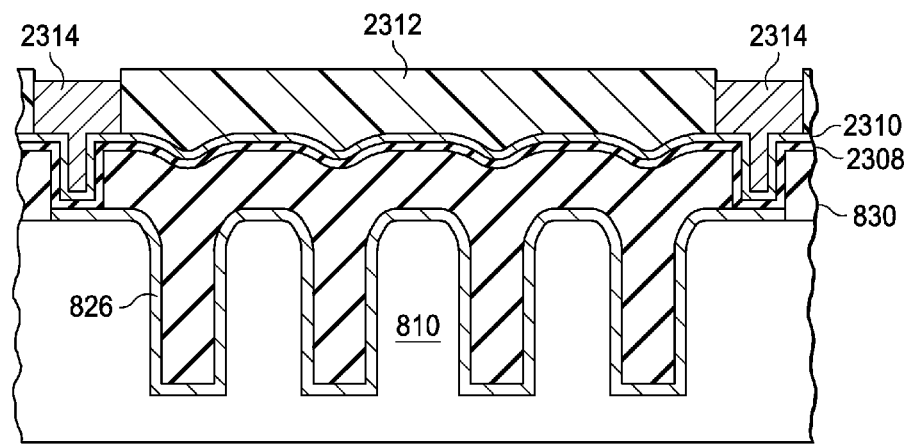

As shown in FIGS. 24A-24B, following the formation of plating mold 2312, copper is electroplated to form a pair of spaced-apart copper plugs 2314. After this, mold 2312 is removed in a conventional manner, followed by the conventional removal of the exposed regions of seed layer 2310 and the exposed regions of barrier layer 2308.

Figure 25A:
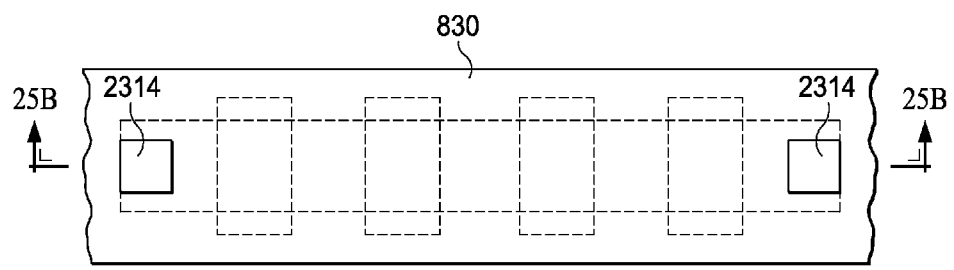
Figure 25B:
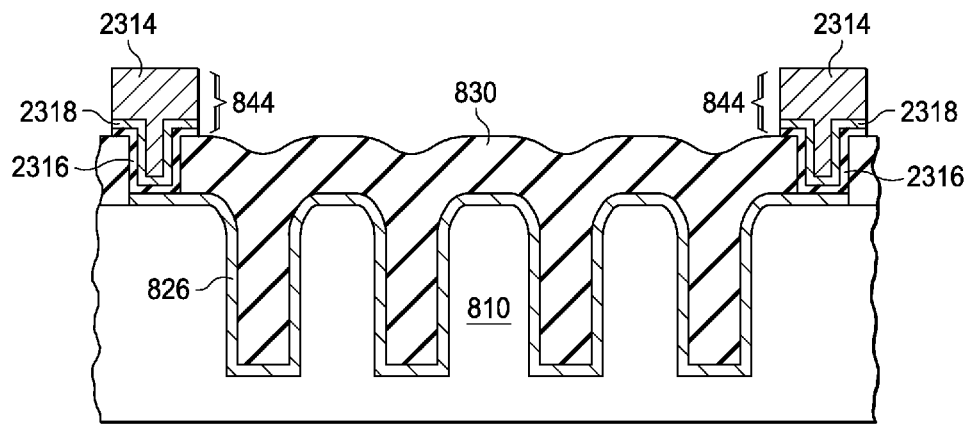

As shown in FIGS. 25A-25B, the conventional removal of the exposed regions of barrier layer 2308 shown in FIGS. 24A-24B leaves a pair of spaced-apart barrier regions 2316. In addition, the conventional removal of the exposed regions of seed layer 2310 shown in FIGS. 24A-24B leaves a pair of spaced-apart seed regions 2318. The pair of spaced-apart barrier regions 2316, the pair of spaced-apart seed regions 2318, and the pair of spaced-apart copper plugs 2314 form the pair of spaced-apart metal head contacts 844.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A resistor comprising:
  a body having:
    a non-conductive top surface, and
    one or more trenches that each extends down from the non-conductive top surface into the body, each of the one or more trenches having a non-conductive inner surface; and
  a thin-film resistor structure that:
    touches a first portion of the non-conductive top surface and a first portion of the inner surface of each of the one or more trenches; and
    exposes a second portion of the non-conductive top surface.

2. The resistor of claim 1 wherein the thin-film structure further exposes a number of second portions of the inner surface of each of the one or more trenches.

3. The resistor of claim 2 wherein the body includes:
  a substrate structure having one or more openings that each has an inner surface that extends down from a top surface of the substrate structure into the substrate structure; and
  a non-conductive layer that touches the top surface of the substrate structure and extends down into each of the one or more openings to cover the inner surface of each of the one or more openings.

4. The resistor of claim 3 wherein the substrate structure is a semiconductor.

5. The resistor of claim 3 and further comprising a layer of isolation material that touches the second portion of the non-conductive top surface, the number of second portions of the inner surface of each of the one or more trenches, and the thin-film resistor structure.

6. The resistor of claim 5 and further comprising a pair of spaced-apart openings that extend through the layer of isolation material to expose a pair of spaced-apart surface regions on the top surface of the thin-film resistor structure.

7. The resistor of claim 6 and further comprising a pair of spaced-apart metal head contacts that extends through the layer of isolation material to touch the spaced-apart surface regions of the thin-film resistor structure, and make electrical connections to the opposite ends of the thin-film resistor structure.

8. The resistor of claim 2 wherein the body is a non-conductive structure.

9. The resistor of claim 8 and further comprising a layer of isolation material that touches the second portion of the non-conductive top surface, the number of second portions of each of the one or more trenches, and the thin-film resistor structure.

10. The resistor of claim 9 and further comprising a pair of spaced-apart metal head contacts that extends through the layer of isolation material to touch the spaced-apart surface regions of the thin-film resistor structure, and make electrical connections to the opposite ends of the thin-film resistor structure.

11. A method of forming a resistor comprising:
  forming a body having:
    a non-conductive top surface, and
    one or more trenches that each extends down from the non-conductive top surface into the body, each of the one or more trenches having a non-conductive inner surface;
  depositing a metal layer that touches the non-conductive top surface and the inner surface of each of the one or more trenches, and forms one or more holes; and etching the metal layer to:
   form a thin-film resistor structure that touches a first portion of the non-conductive top surface and a first portion of the inner surface of each of the one or more trenches; and
   expose a second portion of the non-conductive top surface.

12. The method of claim 11 wherein etching the metal layer also exposes a number of second portions of the inner surface of each of the one or more trenches.

13. The method of claim 12 wherein forming the body includes:
   etching one or more openings in a substrate structure, the one or more openings each has an inner surface that extends down from a top surface of the substrate structure into the substrate structure; and
   forming a non-conductive layer that touches the top surface of the substrate structure and extends down into each of the one or more openings to cover the inner surface of each of the one or more openings.

14. The method of claim 13 wherein the substrate structure is a semiconductor.

15. The method of claim 13 and further comprising forming a layer of isolation material to touch the second portion of the non-conductive top surface, the number of second portions of each of the one or more trenches, and the thin-film resistor structure.

16. The method of claim 15 and further comprising etching the layer of isolation material to form a pair of spaced-apart openings in the layer of isolation material that expose a pair of spaced-apart surface regions on the top surface of the thin-film resistor structure.

17. The method of claim 16 and further comprising forming a pair of spaced-apart metal head contacts that extends through the layer of isolation material to touch the spaced-apart surface regions of the thin-film resistor structure, and make electrical connections to the opposite ends of the thin-film resistor structure.

18. The method of claim 12 wherein forming the body includes etching one or more openings in a non-conductive structure to form the one or more trenches.

19. The method of claim 18 and further comprising forming a layer of isolation material to touch the second portion of the non-conductive top surface, the number of second portions of each of the one or more trenches, and the thin-film resistor structure.

20. The method of claim 19 and further comprising forming a pair of spaced-apart metal head contacts that extends through the layer of isolation material to touch a pair of spaced-apart surface regions of the thin-film resistor structure, and make electrical connections to the opposite ends of the thin-film resistor structure.

* * * * *